United States Patent
Wang et al.

(10) Patent No.: US 9,037,940 B2
(45) Date of Patent: *May 19, 2015

(54) METHOD AND SYSTEM FOR ENCODING FOR 100G-KR NETWORKING

(71) Applicant: Broadcom Corporation, Irvine, CA (US)

(72) Inventors: Zhongfeng Wang, Irvine, CA (US); Hongtao Jiang, Tustin, CA (US); Chung-Jue Chen, Irvine, CA (US); Kang Xiao, Irvine, CA (US)

(73) Assignee: BROADCOM CORPORATION, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/186,308

(22) Filed: Feb. 21, 2014

(65) Prior Publication Data

US 2014/0173384 A1   Jun. 19, 2014

Related U.S. Application Data

(63) Continuation of application No. 13/345,274, filed on Jan. 6, 2012, now Pat. No. 8,689,089.

(60) Provisional application No. 61/430,515, filed on Jan. 6, 2011, provisional application No. 61/576,531, filed on Dec. 16, 2011, provisional application No. 61/577,356, filed on Dec. 19, 2011.

(51) Int. Cl.
*H03M 13/00* (2006.01)
*H04L 1/00* (2006.01)
*H03M 13/15* (2006.01)
(Continued)

(52) U.S. Cl.
CPC ............ *H04L 1/0041* (2013.01); *H04L 1/0057* (2013.01); *H04L 1/0071* (2013.01); *H03M 13/1515* (2013.01); *H03M 13/175* (2013.01); *H03M 13/27* (2013.01); *H03M 13/2778* (2013.01); *H04L 25/4908* (2013.01)

(58) Field of Classification Search
CPC ...................................................... H04L 1/0041
USPC ................................. 714/776, 781, 785, 755
See application file for complete search history.

(56) References Cited

U.S. PATENT DOCUMENTS 5,534,937 A * 7/1996 Zhu et al. ................. 375/240.27
6,529,561 B2 * 3/2003 Sipola ........................... 375/295

(Continued)

OTHER PUBLICATIONS

Rajan Narasimha and Naresh Shanbhag; Design of Energy-Efficient High-Speed Links via Forward Error Correction; IEEE Transactions on Circuits and Systems-II: Express Briefs, vol. 57, No. 5, May 2010.

(Continued)

*Primary Examiner* — Esaw Abraham
(74) *Attorney, Agent, or Firm* — Oblon, McClelland, Maier & Neustadt, L.L.P.

(57) ABSTRACT

Aspects of a method and system for encoding in 100G-KR networking are described. In one example embodiment, a coding method uses certain forward error correcting codes based on a given transcoding method and delivers the codes according to burst interleaving. In another example, a coding method includes receiving source data from a plurality of physical lanes, combining data from the physical lanes to generate a block, transcoding the block, and encoding a data stream including the transcoded block.

20 Claims, 6 Drawing Sheets

(51) Int. Cl.
*H03M 13/27* (2006.01)
*H03M 13/17* (2006.01)
*H04L 25/49* (2006.01)

(56) References Cited

U.S. PATENT DOCUMENTS

| | | | |
|---|---|---|---|
| 7,152,199 B2* | 12/2006 | Nuyen et al. | 714/776 |
| 7,284,184 B2* | 10/2007 | Gallezot et al. | 714/762 |
| 7,343,540 B2* | 3/2008 | Khermosh et al. | 714/758 |
| 7,634,399 B2 | 12/2009 | Hardwick | |
| 7,639,739 B2 | 12/2009 | Rose et al. | |
| 7,676,733 B2 | 3/2010 | Ganga et al. | |
| 7,684,980 B2* | 3/2010 | Rousseau | 704/229 |
| 7,835,401 B2 | 11/2010 | Brown | |
| 7,873,892 B2 | 1/2011 | Ganga et al. | |
| 7,957,963 B2* | 6/2011 | Hardwick | 704/223 |
| 8,108,756 B2 | 1/2012 | Ganga et al. | |

OTHER PUBLICATIONS

Teshima, et al.; Bit-Error-Tolerant (512*N)B/(513*N+1)B Code for 40Gb/s and 100Gb/s Ethernet Transport; NTT Corporation; Yokosuka, Japan; 978-1-4244-2219-7/08 IEEE 2008.

Wang, et al.; Further Studies of FEC Codes for 100G-KR; Power Point Presentation, Nov. 2011, IEEE 802.3bj Meeting, Atlanta.

* cited by examiner

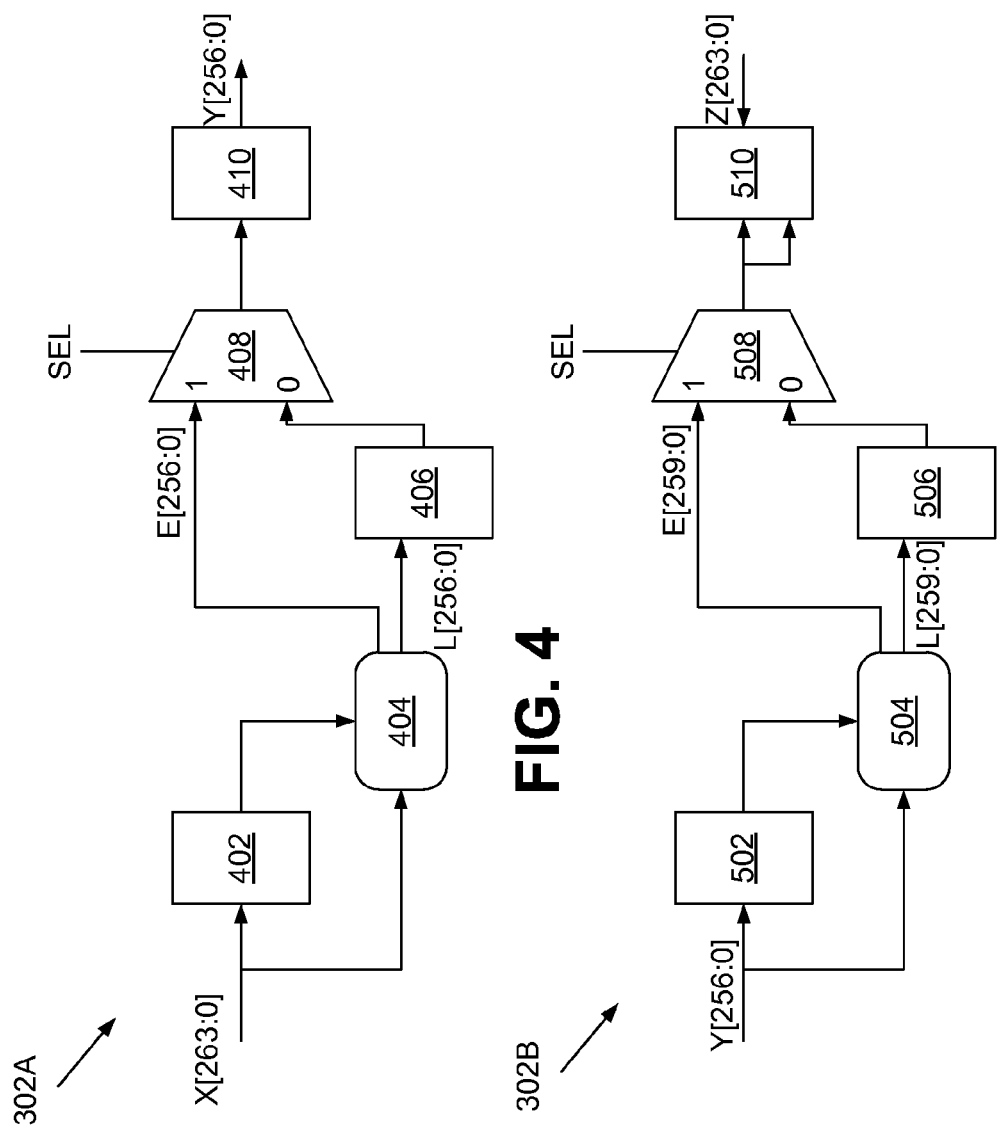

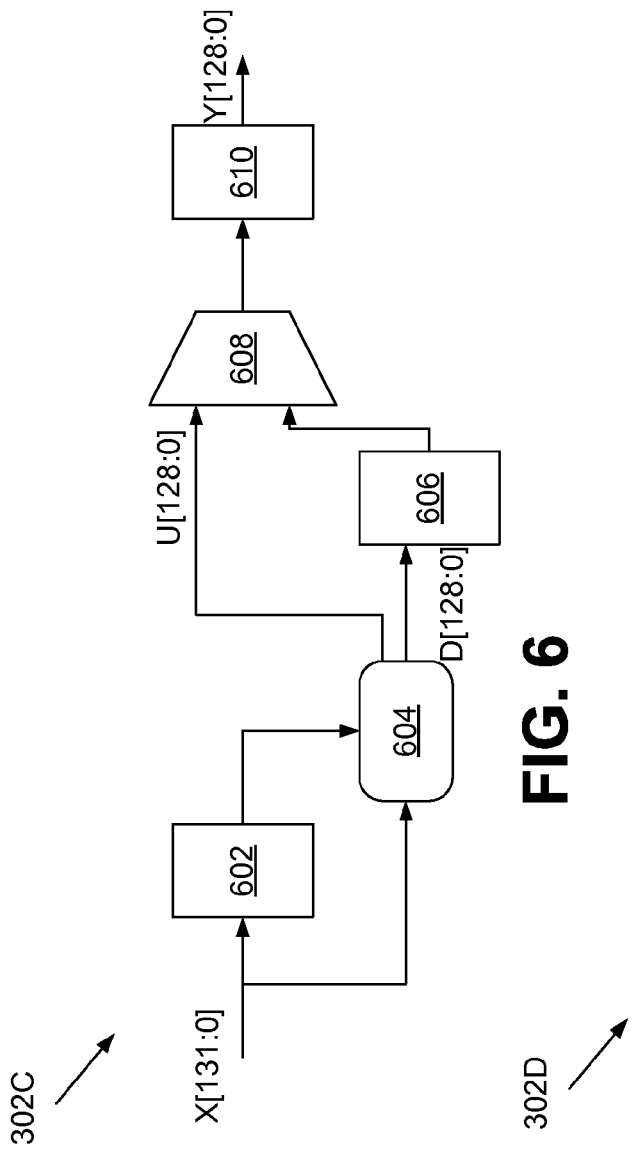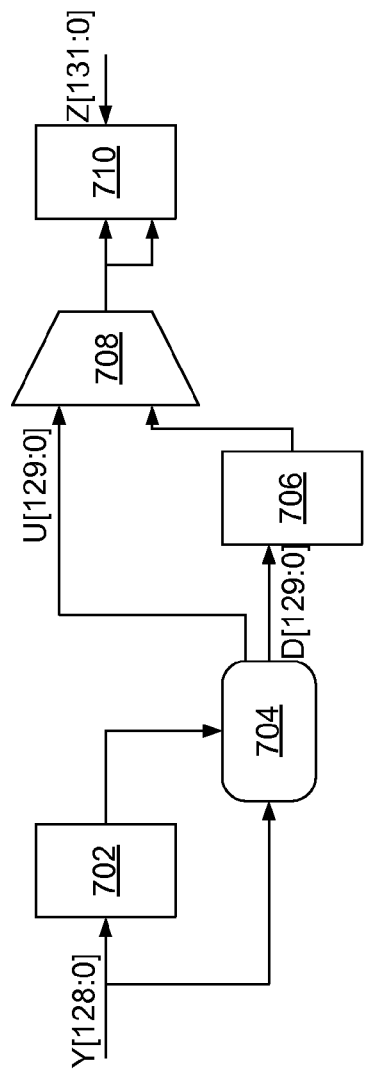

METHOD AND SYSTEM FOR ENCODING FOR 100G-KR NETWORKING

CROSS-REFERENCE TO RELATED APPLICATION

This application is a continuation of U.S. patent application Ser. No. 13/345,274 (now U.S. Pat. No. 8,689,089), entitled "Method and System for Encoding for 100G-KR Networking," filed Jan. 6, 2012, which claims the benefit of U.S. Provisional Patent Application No. 61/430,515, filed Jan. 6, 2011, entitled "Method and System for Encoding for 100G-KR Networking," U.S. Provisional Patent Application No. 61/576, 531, filed Dec. 16, 2011, entitled "Transcoding Method and Architecture," and U.S. Provisional Patent Application No. 61/577,356, filed Dec. 19, 2011, entitled "Transcoding Method and Architecture," each of which applications are hereby incorporated herein by reference in their entirety.

TECHNICAL FIELD

The present disclosure is generally related to 100 G-KR networks, and, more particularly, is related to encoding and decoding in 100 G-KR networks.

BACKGROUND

Users of computer networks today have witnessed an incredible increase in performance capabilities, including speed and integrity of data transfer. Ethernet comprises one type of computer network that offers many varieties in terms of capabilities, including high speed networks such as 40 Gigabit Ethernet (e.g., 40 GbE) and 100 Gigabit Ethernet (e.g., 100 GbE), among others. Such Ethernet networks support sending Ethernet frames at 40 and 100 gigabits per second over multiple 10 Gbit/s or 25 Gbit/s lanes. The 40/100 Gigabit Ethernet standards include a number of different Ethernet physical layer (PHY) specifications, including a criteria where the bit error rate (BER) is less than or equal to 10-12 at the MAC/PCS service interface. To achieve (and/or exceed in meeting) this criteria, various forward error correction schemes have been developed, each representing a compromise in certain parameters such as total latency, net coding gain, burst error correcting capacity, and/or hardware complexity.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIG. 4 is a block diagram of an example embodiment of a transcoder module according to 512B/514B transcoding.

FIG. 5 is a block diagram of an example embodiment of a reverse transcoder module according to 512B/514B reverse transcoding.

FIG. 6 is a block diagram of an example embodiment of a transcoder module according to 256B/258B transcoding.

FIG. 7 is a block diagram of an example embodiment of a reverse transcoder module according to 256B/258B transcoding.

DETAILED DESCRIPTION

Figure 1:
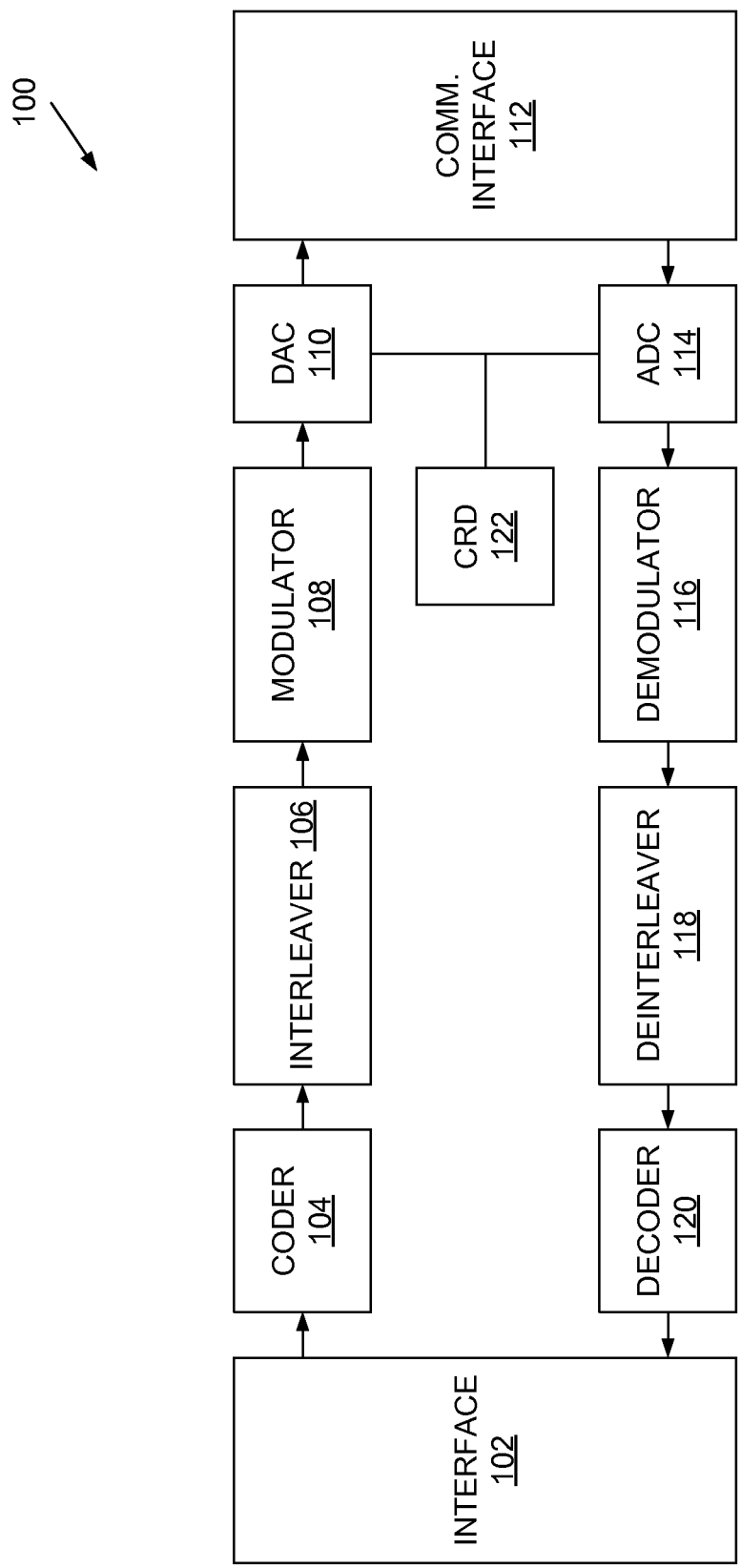
FIG. 1 is a block diagram of an example network environment in which certain embodiments of a coding system may be implemented.

Disclosed herein are certain embodiments of a coding system and method that implement various forward error correction (FEC) coding schemes for high speed Ethernet, such as 100 G-KR. For instance, some embodiments of a coding system comprise one or more burst interleaving schemes, as opposed to bit interleaving, for multi-codes over multiple physical lanes, such as to provide further robustness to burst errors. In some embodiments, various transcoding schemes are employed, such as 256B/258B transcoding, as well as 512B/514B schemes. In some embodiments, certain forward error correcting codes based on Reed-Solomon codes, among others, are utilized based on either 512B/514B transcoding or 256B/258B transcoding to achieve certain performance gains with various trade-offs in coding gain, latency, and/or complexity.

Having summarized various features of certain embodiments of a coding system of the present disclosure, reference will now be made in detail to the description of the disclosure as illustrated in the drawings. While the disclosure is described in connection with these drawings, there is no intent to limit it to the embodiment or embodiments disclosed herein. For instance, though described in the context of 100 G-KR Ethernet systems, other network environments are also contemplated to be within the scope of the disclosure. Further, although the description identifies or describes specifics of one or more embodiments, such specifics are not necessarily part of every embodiment, nor are all various stated advantages associated with a single embodiment. On the contrary, the intent is to cover all alternatives, modifications and equivalents included within the spirit and scope of the disclosure as defined by the appended claims. Further, it should be appreciated in the context of the present disclosure that the claims are not necessarily limited to the particular embodiments set out in the description.

Referring now to FIG. 1, shown is an example environment in which certain embodiments of coding systems and methods may be implemented. In particular, FIG. 1 shows an example embodiment of a high speed Ethernet computer system 100. One having ordinary skill in the art should appreciate in the context of the present disclosure that the example environment 100 is merely illustrative, and that other computer systems and/or architectures may be implemented in some embodiments. The computer system 100 comprises an interface (e.g., to the Ethernet or component(s) coupled thereto), and on a bit stream sending side, a coder 104, interleaver 106, modulator 108, and digital-to-analog converter (DAC) 110 coupled to a communications interface 112. On the receiving side, starting from the communications interface 112, the computer system 100 comprises an analog-to-digital converter (ADC) 114, a demodulator 116, a deinterleaver 118, and a decoder 120, the latter coupled to the interface 102. Also depicted is a clock recovery device (CRD), which may include one or more phase-locked loop circuits and/or software clocking mechanisms, among other clock recovery systems well-known to those having ordinary skill in the art.

The interface 102 and communications interface 112 comprise any one of a plurality of Ethernet interfaces suitable for sending and receiving bit streams according to 100 G-KR media, including IEEE 802.3-based 100 Gigabits/second (Gb/s) Ethernet electrical backplanes and copper cable (e.g., twinaxial) links, as well as suitable for maintaining backwards compatibility to legacy systems interfaces (e.g., for 10 GBase, etc.), XAUI backplanes, etc. The bit stream from the interface 102 may comprise virtual and physical lanes in some embodiments. For instance, for 100 G Ethernet, the bit stream may be carried over twenty (20) virtual lanes per 100 G data stream over one or more physical lanes. In one embodiment, each virtual lane has a data-rate of five (5) Gbps. There may be various configurations for the associated physical lanes, such as four (4) physical lanes X 25 G, two (2) physical lanes X 50 G, etc.

The coder 104 receives the bit streams over the aforementioned lanes and implements transcoding and FEC encoding functionality. In some embodiments, the coder 104 may employ one or more other FEC codes on the transcoded bit stream, including Fire codes or other error correcting codes such as BCH codes, Reed-Solomon (RS) codes, convolutional codes, turbo codes, and/or LDPC codes, among others. The coder 104 employs FEC coding over each virtual lane, each physical lane, or across physical lanes. For purposes of facilitating the description that follows, an embodiment where FEC encoding is performed across physical lanes is assumed.

Figure 2:
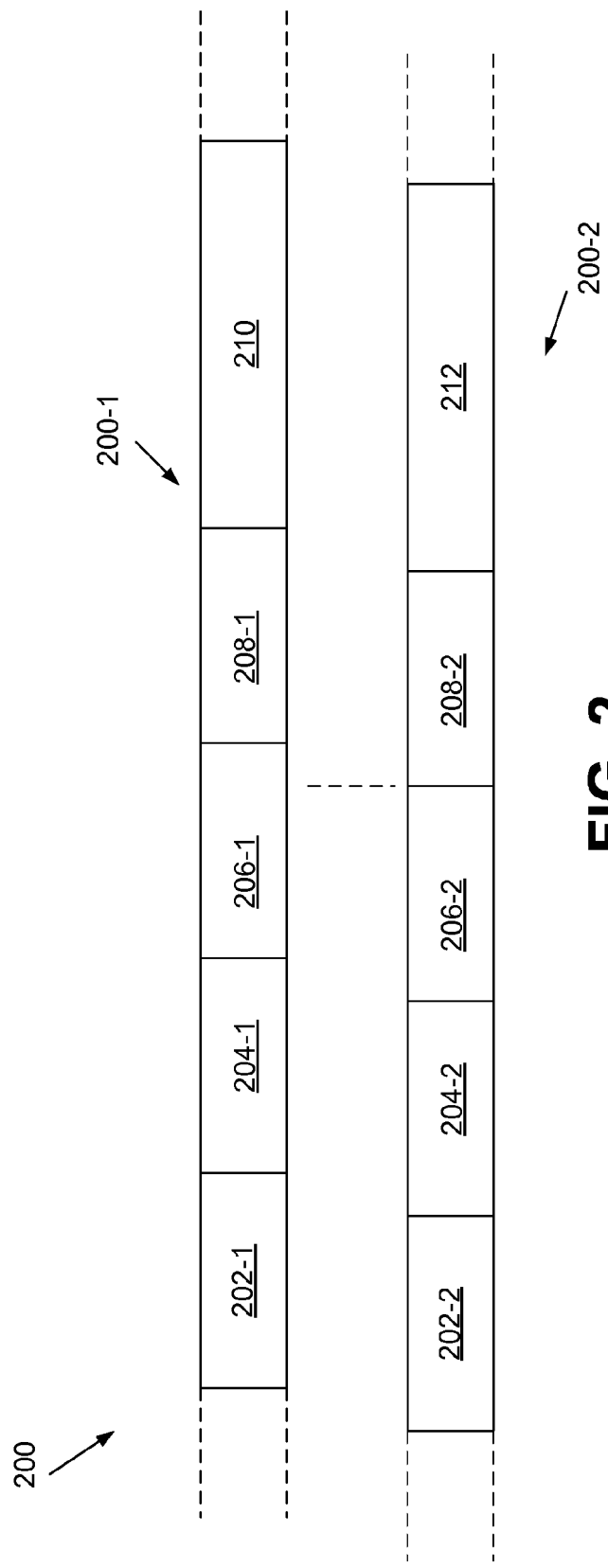
FIG. 2 is a block diagram of an example embodiment of a method for burst interleaving of bit streams.

The output of the coder 104 is provided to an interleaver 106, which is configured to burst interleave the correction codes provided by the FEC encoder and provide the codes along with the data streams over plural channels. For instance, referring to FIG. 2 and digressing briefly, shown is an example method embodiment that illustrates burst-interleaving for multi-lane, multi-code communications. In the example depicted in FIG. 2, multiple physical lanes 200 are shown (e.g., two shown, though not limited to two). In this example, it is assumed that the interleaver 106 interleaves X (X>1) Fire codes (though RS codes may be used, among others) for their transfer (e.g., communication) over media connected to the communications interface 112. Likewise, such interleaved bit streams may be received and decoded by the decoder 120. The X Firecodes include distinct codes 202-1, 204-1, 206-1, and 208-1 (and data packet 210) in physical lane 200-1, and codes 202-2, 204-2, 206-2, and 208-2 (and data packet 212) in physical lane 200-2. Codes 202-1 and 202-2 are the same codes (e.g., total coded data, N and total source data, K and total error correcting capacity, t), as are codes 204-1 and 204-2; similarly with codes 206 and 208. In other words, there are five (5) independent Fire codes applied on each physical lane (e.g., 200-1, 200-2), and these codes are burst interleaved. In some embodiments, the quantity of independent codes may be different (e.g., greater than or less than five). In contrast, conventional systems perform bit-interleaving of, for instance, X codes. That is, bit interleaving is commonly used in digital communications to combat long burst errors. In the example scheme depicted in FIG. 2, a burst-interleaving technique is employed. In some embodiments, bit-interleaving may be employed.

In one embodiment, the interleaver 106 operates according to an assumption that a Fire code can correct bursts of no more than tb bits. By employing burst interleaving for multiple Fire codes, the interleaver 106 may group the coded bits from each Fire code into groups, with each group consists of tg bits, where $1<tg<=tb$. The interleaver 106 interleaves these many Fire codes group by group. Assuming tg=11 bits, then 11 bits may be transmitted for a given physical lane (e.g., 200-1 or 200-2) from the first Fire code 202-1, then another 11 bits from the second Fire code 204-1, etc. In one embodiment, tg=tb. In some embodiments, the code length of a Fire code is larger than its burst error correcting capacity, tb. In some cases, the total coded bits per Fire code block may not be dividable by tb. Thus, the interleaver 106 may be configured to select a value tg, which is very close to tb, as the group size for burst interleaving. In some embodiments, tg=tb for a majority of the groups and tg is set to a smaller value to fill up all the rest of the bits for the entire interleaved code block. Note that burst interleaving for Fire codes is described above, with the understanding that burst interleaving may be employed by the interleaver 106 for other codes. For instance, in embodiments where the component code includes RS codes, the interleaver 106 may perform burst-interleaving as single symbol based interleaving or multiple symbols based interleaving.

Continuing with the description of FIG. 1, the modulator 108 receives the plural streams from the interleaver 106 and implements one of plural types of modulation schemes, such as QPSK, QAM, FSK, among other known modulation schemes. The modulated data is provided to the DAC 110, which prepares frames of data according to an analog signal and provides the analog signal over the communications interface 112 to another network or device.

On the receiving side, bit streams received over the communications interface 112 are digitized by ADC 114 and clocked according to the CRD 122, demodulated by demodulator 116, deinterleaved 118, and provided to decoder 120 to perform error detection and/or correction of the source data for provision to the interface 102 and ultimately another component or system of the computer system 100 or another device or network.

Figure 3:
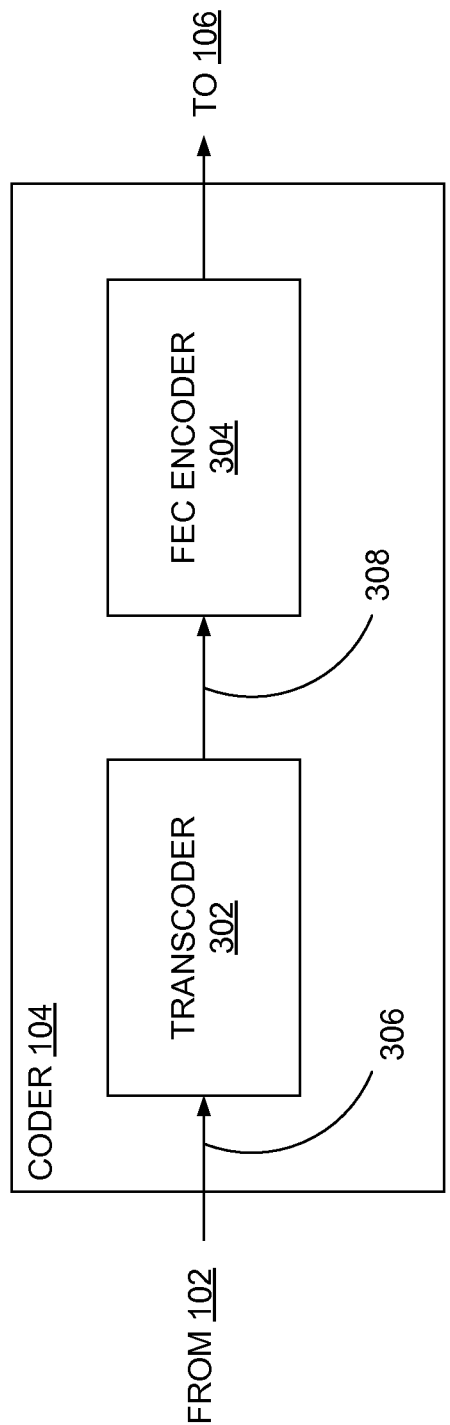
FIG. 3 is a block diagram of an example embodiment of a coding system.

Having generally described an example computer system 100 and methods for burst interleaving, attention is directed to FIG. 3, which shows an example embodiment of a coding system embodied as the coder 104. In some embodiments, the coding system may be embodied with fewer or more components. In some embodiments, the coding system may employ one or more of the components illustrated in FIG. 1 or other components. For instance, some embodiments of a coding system may employ the coder 104 and the interleaver 106. One having ordinary skill in the art should appreciate in the context of the present disclosure that the example coder 104 is merely illustrative, and that other architectures and/or components may be implemented as the coder 104 in some embodiments. The coder 104 comprises a transcoder 302 coupled at its output to a forward error correction (FEC) encoder 304. Although shown as respective single units, in some embodiments, respective multiple units of similar configuration may be employed. The transcoder 302 receives a bit stream from the interface 102 (FIG. 1) over medium 306, which may comprise virtual and physical lanes in some embodiments. For instance, for 1000 Ethernet, the bit stream may be carried over twenty (20) virtual lanes per 1000 data stream over one or more physical lanes on connection 306. In one embodiment, each virtual lane has a data rate of five (5) Gbps, though not limited to five (5) Gbps. There may be various configurations for the associated physical lanes, such as four (4) physical lanes X 25 G, two (2) physical lanes X 50 G, etc. The transcoder 302 processes these bit streams according to one or more transcoding methods, as explained below.

The FEC encoder 304 receives the transcoded bit streams over connection 308 and employs FEC coding over each virtual lane (VL), each physical lane (PL), or across physical lanes. In some cases, transcoding is performed on each VL or on each PL. As described above, FEC encoding across physical lanes is described, with the understanding that similar principles apply for encoding over (or on) virtual lanes and/or physical lanes. Here transcoding is assumed to be performed across PLs. In some embodiments, FEC coding is implemented using a redundancy ratio (RR) suitable for use in 100 G-KR (e.g., 1/65). In some embodiments, the redundancy ratio is increased to obtain a higher coding gain, for instance by adding redundancy bits into one or more 66-bit blocks. That is, assuming the use of one 66-bit block for extra parity bits, up to sixty-six (66) bits of this block may be used to store extra parity bits. For instance, with regard to RS codes, some example configurations that may be employed by the FEC encoder 304 include:

RS (270, 260, t=5) over GF($2^m$), where 54 bits are used (when m=9), or 60 bits (when m=10), of one 66-bit block for storing extra parity bits.

RS (140, 130, t=5) over GF($2^8$), where 64 bits out of one 66-bit block are used.

RS (138, 130, t=4) over GF($2^{10}$), where 60 bits out of one 66-bit block are used.

In some embodiments, the FEC encoder 304 may employ one or more other FEC codes, including Fire codes (as explained above) or other error correcting codes such as BCH codes, RS codes, convolutional codes, turbo codes, and/or LDPC codes, among others. Some example codes include the following:

1) RS (528, 514, t=7) over GF($2^m$), m=10, 11, etc.,
2) RS (544,514, t=15) over GF ($2^m$), m=10, 11, etc.,
3) RS (536, 514, t=11) over GF($2^m$), m=10,11, etc.,
4) RS (544, 516, t=14) over GF($2^m$), m=10, 11, etc.,
5) RS(132, 130, t=1) over GF($2^m$), m=8, 9, 10, etc.,
6) RS(264, 262, t=2) over GF($2^m$), m=9, 10, etc.,
7) RS(396, 390, t=3), over GF($2^m$), m=9, 10, etc.,
8) RS(528, 520, t=4), over GF($2^m$), m=10, 11, etc.,
9) RS(660, 650, t=5) over GF($2^m$), m=10, 11, etc.,
10) RS(792, 780, t=6) over GF($2^m$), m=10, 11, etc.,
11) Fire code (858, 845, tb=3),
12) Fire code (990, 975, tb=4),
13) Fire code (1056, 1040, tb=5),
14) BCH (2376, 2340, t=3).

In the above, RS(N, K, t) denotes a Reed-Solomon code with total source data of K symbols and total coded data of N symbols, and the guaranteed error correcting capacity is t symbols. The symbols size is m bits if it is defined over GF($2^m$). In the description that follows, RS-encoding based on 512B/514B transcoding is described, among other transcoding schemes that may be employed in some embodiments. Specifically, in the above code list, code 1), 2) and 3) is used together with 512B/514B transcoding. Code 4) is used based on 256B/258B transcoding. Code 5) to code 14) are all based on 64B/65B transcoding. Referring to FIG. 3, one embodiment of the transcoder 302 is configured to perform 512B/514B transcoding. One having ordinary skill in the art should understand the implementation details of 512B/514B transcoding. Additional information on 512B/514B transcoding may be found in "Bit-Error-Tolerant (512*N)B/(513*N+1)B Code for 40 Gb/s and 100 Gb/s Ethernet, Transport," by Mitsuhiro Teshima et al., IEEE Infocom Workshops 2008, and incorporated herein by reference in its entirety. In general, the transcoder 302 is configured to transfer eight 66-bit blocks into a large block of 514 bits. For instance, each physical lane provides source data of 20×66-bit blocks. The transcoder 302 combines 2×66-bit blocks from each physical lane to form a 528-bit large block. The transcoder 302 then employs 512B/514B transcoding to generate 514-bit data and sends the data to the FEC encoder 304. In one embodiment, the FEC encoder 304 may be configured for encoding based on RS (528, 514, t=7) defined over GF($2^{10}$). One of a plurality of different implementation options may be employed by the FEC encoder 304 for this RS code.

For instance, in one embodiment, the FEC encoder 304 gets (e.g., accesses, such as from memory or registers) sixteen (16) symbols (e.g., 160 bits) for the first thirty-two (32) cycles and gets two (2) symbols at the last cycle per each frame. The FEC encoder 304 sends out sixteen (16) symbols per cycle with each physical lane transmitting four (4) symbols per cycle. In this implementation, it takes thirty-three (33) cycles to transmit an FEC frame. A decoder, such as decoder 120, receiving such a bit stream may take (e.g., receive or access) sixteen (16) symbols per cycle with a total of thirty-three (33) cycles to receive data of each FEC frame. Alternatively, the decoder may take twenty-four (24) symbols per cycle with a total of twenty-two (22) cycles to receive data of each FEC coded frame.

In another embodiment utilizing RS (528, 514, t=7) codes, a second implementation comprises the FEC encoder 304 getting (e.g., accessing) twenty-four (24) symbols (e.g., 240 bits) for the first twenty-one (21) cycles and get ten (10) symbols at the last cycle per each frame. The FEC encoder 304 sends out twenty-four (24) symbols per cycle with each physical lane transmitting six (6) symbols. Stated otherwise, it takes twenty-two (22) cycles to transmit an FEC frame. For a decoder, such as decoder 120, operating on these coded symbols, the decoder takes sixteen (16) symbols per cycle with a total of thirty-three (33) cycles to receive data of each FEC frame. Alternatively, the decoder takes twenty-four (24) symbols per cycle with a total of twenty-two (22) cycles to receive data of each FEC coded frame.

In some embodiments, a code consisting of RS(544, 514, t=15) defined over GF($2^{10}$) may be employed. The transcoder 302 receives each physical lane, which provides source data of 20×66-bit blocks, combines 2× 66-bit blocks from each physical lane to form a 528-bit large block, uses 512B/514B transcoding to generate 514-bit data, and sends the coded data to the FEC encoder 304. As before, certain embodiments of the FEC encoder 304 may use different implementation options. For instance, one embodiment of the FEC encoder 304 may use an implementation whereby the FEC encoder 304 gets sixteen (16) symbols (e.g., 160 bits) for the first thirty-two (32) cycles and gets two (2) symbols at the thirty-third (33rd) cycle and no data at the last cycle per each frame. The FEC encoder 304 sends out sixteen (16) symbols per cycle with each physical lane transmitting four (4) symbols, taking thirty-four (34) cycles to transmit an FEC frame. A decoder, such as decoder 120, takes sixteen (16) symbols per cycle with a total of thirty-four (34) cycles to receive data of each FEC frame, or it takes thirty-two (32) symbols per cycle with a total of seventeen (17) cycles to receive data of each FEC coded frame.

In another embodiment (e.g., using the code consisting of RS(544, 514, t=15) defined over GF($2^{10}$)) utilizing a second implementation option, the FEC encoder 304 gets thirty-two (32) symbols (e.g., 320 bits) for the first sixteen (16) cycles and gets two (2) symbols at the last cycle per each frame. The FEC encoder 304 sends out thirty-two (32) symbols per cycle with each physical lane transmitting eight (8) symbols, taking seventeen (17) cycles to transmit an FEC frame. In a decoder, such as decoder 120 receiving these codes, the decoder either takes sixteen (16) symbols per cycle with a total of thirty-four (34) cycles to receive data of each FEC frame, or in some implementations, takes thirty-two (32) symbols per cycle with a total of seventeen (17) cycles to receive data of each FEC coded frame.

In some embodiments, a code consisting of RS(536, 514, t=11) defined over GF(2^10) may be employed. The transcoder 302 receives each physical lane, which provides source data of 20×66-bit blocks, combines 2×66-bit blocks from each physical lane to form a 528-bit large block, uses 512B/514B transcoding to generate 514-bit data, and sends transcoded data to the FEC encoder 304. For instance, one embodiment of the FEC encoder 304 may use an implementation whereby the FEC encoder 304 gets sixteen (16) symbols for the first thirty-two (32) cycles and accesses two (2) symbols at the thirty-third (33rd) cycle per each frame. The FEC encoder 304 sends out four (4) symbols per cycle (for a total of thirty-two (32) cycles) with each physical lane transmitting two (2) symbols for the thirty-third (last) cycle to transmit an FEC frame.

Referring now to FIG. 4, shown is an example embodiment of an architecture for 512B/514B transcoding. For instance, FIG. 4 shows transcoding module 302A. In FIG. 4, the transcoding module 302A corresponds to the transcoder 302, and comprises plural registers 402 (e.g., 264-bit register), 406 (e.g., 257-bit register), and 410 (e.g., 257-bit register), combinational logic 404, and a multiplexer 408 (e.g., 2:1) with a select (SEL) port. Data X[263:0] is received at the register 402 and provided also to combinational logic 404. The output of the combinational logic 404 comprises early part E[256:0] to the input of multiplexer 408 and later part L[259:0] to the input of the register 406, the latter which provides the other input to the multiplexer 408. In other words, the combinational block 404 generates data bits with the split synch bits as described above. The multiplexer 408 outputs to the register 410 the multiplexed data, and the output of the register 410 comprises output data Y[256:0]. In operation, the select signal, SEL, is set to ensure the early part of 514 bits, i.e., E[256:0] is sent one cycle earlier than the corresponding later part of 514 bits, i.e., L[256:0]. In either branch of 257-bit data, one sync bit is included, the rest are data and/or control portions.

Referring to FIG. 5, shown is an example embodiment of a reverse transcoding (512B/514B) module 302B (corresponding to an embodiment of the transcoding module 302 in FIG. 3) that comprises registers 502 (e.g., 257-bit register), 506 (e.g., 260-bit register), and 510 (e.g., 264-bit register), combinational logic 504, and multiplexer 508 (e.g., 2:1). Data X[256:0] is received at the register 502 and also at the combinational logic 504. The combination logic 504 outputs data early part E[259:0] to the input of multiplexer 508. The combinational logic 504 also outputs data later part L[129:0] to the register 506, the latter which outputs data to the input of the multiplexer 508. The multiplexer 508 outputs data to register 510, which in turn outputs data Z[263:0]. In operation, where the select signal, SEL, is set to ensure the early part of 520 bits, i.e., E[259:0] is sent one cycle earlier than the corresponding later part of 520 bits, i.e., L[259:0]. At the output side of the 2:1 multiplexer 508, the data is in a format of 4×65 bits, where one sync bit is included in each 65-bit sub-block. There is a simple logic operation to convert each one (1) sync bit into two (2) sync bits, i.e., 1→10, and 0→01, in the connection to the final output register 510.

Although certain embodiments of a coding system have been disclosed based on a 512B/514B transcoding method, it should be appreciated within the context of the present disclosure that the above example RS codes (or other codes) may be implemented by the FEC encoder 304 based on implementation by the transcoder 302 of other transcoding schemes. For instance, in one embodiment, RS encoding may be based on a 256B/258B transcoding method implemented in similar manner to that described above for 512B/514B transcoding methods. Specifically, as is known, a 1-bit flag field and 4-bit control block type words are used in 512B/514B schemes. Operation is the same in this use of the 1-bit flag field and the 4-bit control field in the coding system embodiment that is based on 256B/258B transcoding. In addition, a 3-bit position field is used in 256B/258B, as is known for 512B/514B, with a difference. In particular, as a 256-bit block only contains four (4) 64-bit blocks, only two (2) bits instead of three (3) bits (the latter for the 512B/514B case) are used to indicate the position of a 64-bit block within a 256-bit large block. The third bit may be used as a parity bit for the other two (2) bits, such as for error detection. To protect the synch bits from burst error effects, one embodiment of the FEC encoder 304 separates the two (2) synch bits as follows:

1st synch bit+128-bit data+2nd synch bit+128-bit data–>258-bit block

Referring now to FIGS. 6-7, shown are embodiments of a transcoding architecture and a reverse transcoding architecture for 256B/258B transcoding, respectively. As noted previously in FIGS. 4-5, similar architectures may be derived for 512B/514B transcoding, with at least one difference exhibited by the data bus-width for each signal in the data flow. For instance, FIG. 6 shows transcoding module 302C and FIG. 7 shows reverse transcoding module 302D. In FIG. 6, the transcoding module 302C corresponds to the transcoder 302, and comprises plural registers 602 (e.g., 132-bit register), 606 (e.g., 129-bit register), and 610 (e.g., 129-bit register), combinational logic 604, and a multiplexer 608 (e.g., 2:1), similar to that shown for FIGS. 4-5. Data X[131:0] is received at the register 602 and provided also to combinational logic 604. The output of the combinational logic 604 comprises upper part U[128:0] to the input of multiplexer 608 and lower part D[128:0] to the input of the register 606, the latter which provides the other input to the multiplexer 608. In other words, the combinational block 604 generates data bits with the split synch bits as described above. The multiplexer 608 outputs to the register 610 the multiplexed data, and the output of the register 610 comprises output data Y[128:0].

With reference to FIG. 7, the reverse transcoding module 302D comprises registers 702 (e.g., 129-bit register), 706 (e.g., 129-bit register), and 710 (e.g., 132-bit register), combinational logic 704, and multiplexer 708 (e.g., 2:1). Data Y[128:0] is received at the register 702 and also at the combinational logic 704. The combinational logic 704 outputs data (upper part) U[129:0] to the input of multiplexer 708. The combinational logic 704 also outputs data (lower part) D[129:0] to the register 706, the latter which outputs data to the input of the multiplexer 708. The multiplexer 708 outputs data to register 710, which in turn outputs data Z[131:0]. The data Z is in a format of 2×66 bits, where a 66-bit block comprises two (2) sync bits and sixty-four (64) bits of data or control block. Note that the output of the multiplexer 708 is one-hundred thirty (130) bits, whereas the output of the register 710 is one-hundred thirty-two (132) bits. The reverse transcoding module 302D converts the 65-bit block to a 66-bit block. In other words, for each synch bit in a 65-bit block, the reverse transcoding module 302D forms two (2) bits (e.g., "0" becomes "01," and "1" becomes "10" in 66-bit blocks at the output).

The coding system of the present disclosure may be implemented in hardware, software, firmware, or a combination thereof. In the embodiment(s) depicted in FIG. 3, the coding system (e.g., coder 104), interleaver 106, among other components, are implemented with any or a combination of the following technologies, which are all well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc. In embodiments where functionality of the coding system or associated components are implemented in software and/or firmware, such software or firmware may be stored in a memory and that is executed by a suitable instruction execution system of the computing system 100 or of another host device.

Figure 8:
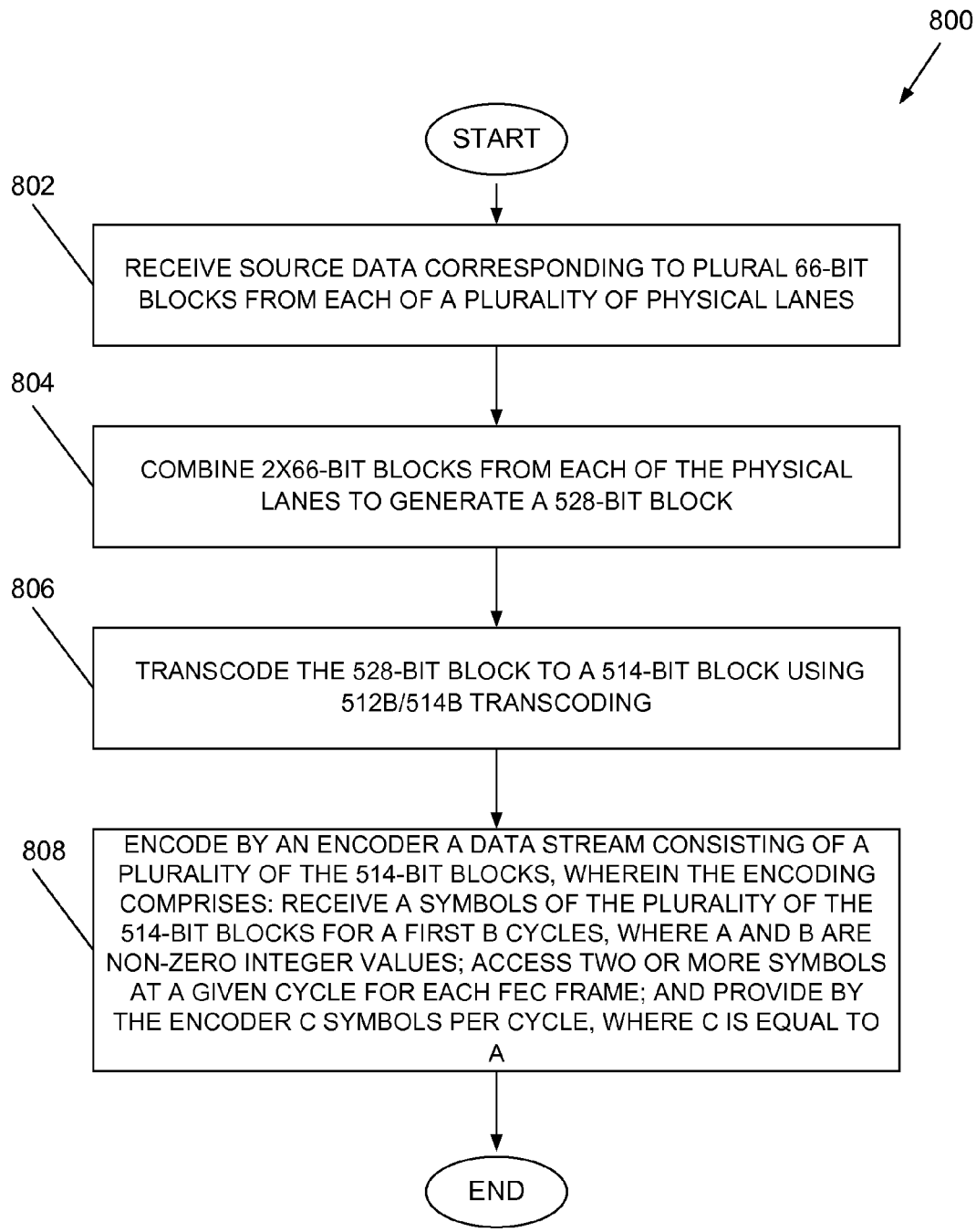
FIG. 8 is a flow diagram of an example embodiment of a coding method.

Having described certain embodiments of coding systems, one coding method embodiment, illustrated in FIG. 8 and denoted as method 800 comprises receiving source data corresponding to plural 66-bit blocks from each of a plurality of physical lanes (802); combining 2×66-bit blocks from each of the physical lanes to generate a 528-bit block (804); transcoding the 528-bit block to a 514-bit block using 512B/514B transcoding (806); and encoding by an encoder a data stream consisting of a plurality of the 514-bit blocks, wherein the encoding comprises: receiving A symbols of the plurality of the 514-bit blocks for a first B cycles, where A and B are non-zero integer values; accessing two or more symbols at a given cycle for each FEC frame; and providing by the encoder C symbols per cycle, where C is equal to A (808).

Any process descriptions or blocks in flow diagrams should be understood as representing modules, segments, or portions of code which include one or more executable instructions for implementing specific logical functions or steps in the process, and alternate implementations are included within the scope of the preferred embodiment of the present disclosure in which functions may be executed out of order from that shown or discussed, including substantially concurrently or in reverse order, depending on the functionality involved, as would be understood by those reasonably skilled in the art of the present disclosure. In addition, the scope of the certain embodiments of the present disclosure includes embodying the functionality of the disclosed herein in logic embodied in hardware or software-configured mediums.

It should be emphasized that the above-described embodiments of the present disclosure, particularly, any "preferred" embodiments, are merely possible examples of implementations, merely set forth for a clear understanding of the principles of the disclosed embodiments of the coding system. Many variations and modifications may be made to the above-described embodiment(s) without departing substantially from the spirit and principles. For instance, though described using certain RS codes, it should be appreciated in the context of the present disclosure that other codes, RS or otherwise, may be employed in some embodiments using the described systems and methods. All such modifications and variations are intended to be included herein within the scope of this disclosure and protected by the following claims.

The invention claimed is:

1. A coding method, comprising:
   combining blocks from each of a plurality of physical lanes to generate a block;
   transcoding the block to a transcoded block; and
   encoding, with an encoder, a data stream consisting of a plurality of the transcoded blocks into encoded symbols, wherein the encoding comprises:
   receiving A symbols of the plurality of transcoded blocks for a first B cycles, where A and B are non-zero integer values;
   accessing two or more symbols at a given cycle for each forward error correction (FEC) frame generated based on the plurality of transcoded blocks; and
   providing, from the encoder, C symbols per cycle, where C is a non-zero integer value equal to A.

2. The coding method of claim 1, wherein the block is one of a 132, 264, 396, 528, 536, 544, 660, or 792-bit block.

3. The method of claim 1, wherein A is equal to one of 16, 24, and 32, and B is equal to one of 16, 17, 21, 22, 32, and 33.

4. The coding method of claim 1, wherein the accessing comprises accessing two symbols at a last cycle for each FEC frame, and the providing comprises providing four symbols per cycle over each physical lane for a total of thirty-three cycles to transmit a single FEC frame.

5. The coding method of claim 4, wherein the encoding is based on Reed-Solomon (RS) codes, RS (N, K, t), wherein N is a total number of symbols of coded data, K is a total number of symbols of source data, and t is an error correcting capacity in units of symbols, wherein N is equal to 528, K is equal to 514, and t is equal to 7, RS (N, K, t) defined over a Galois field of $2^{10}$.

6. The coding method of claim 1, wherein the accessing comprises accessing two symbols at a thirty-third cycle for each FEC frame and no data is accessed at a last cycle of each FEC frame, and the providing comprises providing four symbols per cycle over each physical lane for a total of thirty-four cycles to transmit a single FEC frame.

7. The coding method of claim 6, wherein the encoding is based on Reed-Solomon (RS) codes, RS (N, K, t), wherein N is a total number of symbols of coded data, K is a total number of symbols of source data, and t is an error correcting capacity in units of symbols, wherein N is equal to 544, K is equal to 514, and t is equal to 15, RS (N, K, t) defined over a Galois field of $2^{10}$.

8. The coding method of claim 1, wherein the accessing comprises accessing at a last cycle for each FEC frame, and the providing comprises providing eight symbols per cycle over each physical lane for a total of seventeen cycles to transmit a single FEC frame.

9. The coding method of claim 8, wherein the encoding is based on Reed-Solomon (RS) codes, RS (N, K, t), wherein N is a total number of symbols of coded data, K is a total number of symbols of source data, and t is an error correcting capacity in units of symbols, wherein N is equal to 544, K is equal to 514, and t is equal to 15, RS (N, K, t) defined over a Galois field of $2^{10}$.

10. The coding method of claim 1, wherein the accessing comprises accessing at a thirty-third cycle for each FEC frame, and the providing comprises providing four symbols per cycle over each physical lane for a total of 32 cycles and providing two symbols over each physical lane for the thirty-third cycle, to transmit a single FEC frame.

11. The coding method of claim 10, wherein the encoding is based on Reed-Solomon (RS) codes, RS (N, K, t), wherein N is a total number of symbols of coded data, K is a total number of symbols of source data, and t is an error correcting capacity in units of symbols, wherein N is equal to 536, K is equal to 514, and t is equal to 11, RS (N, K, t) defined over a Galois field of $2^{10}$.

12. The coding method of claim 1, wherein the accessing comprises accessing ten symbols at a last cycle for each FEC frame, and the providing comprises providing six symbols per cycle over each physical lane for a total of twenty-two cycles to transmit a single FEC frame.

13. The coding method of claim 12, wherein the encoding is based on Reed-Solomon (RS) codes, RS (N, K, t), wherein N is a total number of symbols of coded data, K is a total number of symbols of source data, and t is an error correcting capacity in units of symbols, wherein N is equal to 528, K is equal to 514, and t is equal to 7, RS (N, K, t) defined over a Galois field of 2^10.

14. The coding method of claim 1, further comprising burst interleaving the encoded symbols, the burst interleaving comprising single symbol based interleaving or multiple symbol based interleaving.

15. A coding system, comprising:
one or more circuits configured to:
  combine blocks from each of a plurality of physical lanes to generate a block;
  transcode the block to a transcoded block;
  receive A symbols of a plurality of the transcoded blocks for a first B cycles, where A and B are non-zero integer values;
  access two or more symbols at a given cycle for each forward error correction (FEC) frame generated based on the plurality of transcoded blocks; and
  provide C symbols per cycle, where C is a non-zero integer value equal to A.

16. The coding system of claim 15, wherein the block is one of a 132, 264, 396, 528, 536, 544, 660, or 792-bit block.

17. The coding system of claim 15, wherein A is equal to one of 16, 24, and 32, and B is equal to one of 32, 21, and 16.

18. The coding system of claim 15, wherein the one or more circuits are further configured to:
  access two symbols at a last cycle for each FEC frame; and
  provide four symbols per cycle over each physical lane for a total of thirty-three cycles to transmit a single FEC frame.

19. A non-transitory computer-readable medium including instructions, which when executed by circuitry, cause the circuitry to:
  combine blocks from each of a plurality of physical lanes to generate a block;
  transcode the block to a transcoded block;
  receive A symbols of a plurality of the transcoded blocks for a first B cycles, where A and B are non-zero integer values;
  access two or more symbols at a given cycle for each forward error correction (FEC) frame generated based on the plurality of transcoded blocks; and
  provide C symbols per cycle, where C is a non-zero integer value equal to A.

20. The non-transitory computer-readable medium of claim 19, wherein
  the block is one of a 132, 264, 396, 528, 536, 544, 660, or 792-bit block,
  A is equal to one of 16, 24, and 32, and B is equal to one of 32, 21, and 16, and
  the instructions further cause the circuitry to
    access two symbols at a last cycle for each FEC frame; and
    provide four symbols per cycle over each physical lane for a total of thirty-three cycles to transmit a single FEC frame.

* * * * *